US009034196B2

(12) United States Patent
Mouradian et al.

(10) Patent No.: US 9,034,196 B2
(45) Date of Patent: May 19, 2015

(54) MICROFLUIDIC DEVICE WITH A FILTER

(75) Inventors: Stephane Mouradian, Menlo Park, CA (US); Josh Molho, Oakland, CA (US); Ming Wu, Redwood City, CA (US); Hayley Wu, Sunnyvale, CA (US); Javier A. Farinas, Los Altos, CA (US)

(73) Assignee: Caliper Life Sciences, Inc., Hopkinton, MA (US)

(*) Notice: Subject to any disclaimer, the term of this patent is extended or adjusted under 35 U.S.C. 154(b) by 0 days.

(21) Appl. No.: 13/238,342

(22) Filed: Sep. 21, 2011

(65) Prior Publication Data

US 2012/0009098 A1 Jan. 12, 2012

Related U.S. Application Data

(62) Division of application No. 11/745,411, filed on May 7, 2007.

(51) Int. Cl.
*B01D 29/00* (2006.01)
*B01L 3/00* (2006.01)
*B81C 1/00* (2006.01)

(52) U.S. Cl.
CPC ..... *B01L 3/502761* (2013.01); *B01L 3/502715* (2013.01); *B01L 2200/027* (2013.01); *B01L 2300/0681* (2013.01); *B01L 2300/0816* (2013.01); *B01L 2300/0819* (2013.01)

(58) Field of Classification Search
CPC ............ B81C 1/00119; B81C 1/00103; B81C 1/00111; B81C 1/00; B81C 1/00015; B81C 1/00023; B81C 1/00031; B81C 1/00055; B81C 1/00063; B81C 1/00071; B81C 1/00079; B81C 1/00126; B81C 1/00349; B81C 1/00357; B81C 1/00373; B81C 1/0038; B81C 1/00396; B81C 1/00404; B81C 2201/00; B81C 2201/01; B81C 2201/0101; B81C 2201/0174; B81C 2201/0176; B81C 2201/0181; B81C 2201/0183; B81C 2201/019; B81C 2201/0191; B81C 2201/0197; B81C 2201/0198; B01D 29/0002; B01D 29/0004; B01D 29/0093; B01D 29/01; B01L 3/5027; B01L 3/502753; B01L 3/502761; B01L 3/54; B01L 3/545; B01L 3/56; B01L 3/561; B01L 3/569; B01L 9/527; B01L 2200/026; B01L 2200/027
USPC .......... 137/828; 210/314, 295, 299, 300, 301, 210/303, 435, 779
See application file for complete search history.

(56) References Cited

U.S. PATENT DOCUMENTS

| | | | | |
|---|---|---|---|---|
| 5,296,375 | A | 3/1994 | Kricka et al. | |
| 6,193,647 | B1 * | 2/2001 | Beebe et al. | 600/33 |
| 6,488,897 | B2 * | 12/2002 | Dubrow et al. | 422/502 |
| 7,312,611 | B1 * | 12/2007 | Harrison et al. | 324/453 |
| 2002/0106786 | A1 * | 8/2002 | Carvalho et al. | 435/287.3 |

(Continued)

FOREIGN PATENT DOCUMENTS

WO WO 0138865 A1 * 5/2001

OTHER PUBLICATIONS

Li et al. (Analyst, 2003, 128, 1137-1142).*

*Primary Examiner* — Allison Fitzsimmons
(74) *Attorney, Agent, or Firm* — Cardinal Law Group

(57) ABSTRACT

A microfluidic device with a filter includes a substrate; a flowpath including a well formed in the substrate in fluid communication with a channel formed in the substrate; and a filter disposed across the flowpath and associated with the channel.

8 Claims, 9 Drawing Sheets

(56) References Cited

U.S. PATENT DOCUMENTS

2003/0136451 A1* 7/2003 Beebe et al. .................. 137/828
2003/0178075 A1* 9/2003 Moon et al. ................... 137/833
2004/0259238 A1* 12/2004 Bashir et al. ............... 435/287.1

* cited by examiner

MICROFLUIDIC DEVICE WITH A FILTER

CROSS-REFERENCES TO RELATED APPLICATIONS

This application is a divisional of U.S. patent application Ser. No. 11/745,411, filed May 7, 2007, which is hereby incorporated herein by reference in its entirety for all purposes.

TECHNICAL FIELD

The present invention relates to chemical or biochemical analysis devices, particularly, a microfluidic device with a filter.

BACKGROUND OF THE INVENTION

Microfluidics refers to a set of technologies involving the flow of fluids through channels having at least one linear interior dimension, such as depth or radius, of less than 1 mm. It is possible to create microscopic equivalents of bench-top laboratory equipment such as beakers, pipettes, incubators, electrophoresis chambers, and analytical instruments within the channels of a microfluidic device. Since it is also possible to combine the functions of several pieces of equipment on a single microfluidic device, a single microfluidic device can perform a complete analysis that would ordinarily require the use of several pieces of laboratory equipment. A microfluidic device designed to carry out a complete chemical or biochemical analysis is commonly referred to as a micro-Total Analysis System (μ-TAS) or a "lab-on-a chip."

A lab-on-a-chip type microfluidic device, which can simply be referred to as a "chip," is typically used as a replaceable component, like a cartridge or cassette, within an instrument. The chip and the instrument form a complete microfluidic system. The instrument can be designed to interface with microfluidic devices designed to perform different assays, giving the system broad functionality. For example, the commercially available Agilent 2100 Bioanalyzer system can be configured to interface with four different types of assays, namely, DNA (deoxyribonucleic acid), RNA (ribonucleic acid), protein and cell assays, by simply placing the appropriate type of chip into the instrument.

In a typical microfluidic system, all of the microfluidic channels are in the interior of the chip. The instrument can interface with the chip by performing a variety of different functions: supplying the driving forces that propel fluid through the channels in the chip, monitoring and controlling conditions (e.g., temperature) within the chip, collecting signals emanating from the chip, introducing fluids into and extracting fluids out of the chip, and possibly many others. The instruments are typically computer controlled so that they can be programmed to interface with different types of chips and to interface with a particular chip in such a way as to carry out a desired analysis.

Microfluidic devices designed to carry out complex analyses will often have complicated networks of intersecting channels with some of the channels being open to the outside of the microfluidic devices through one or more wells. Performing the desired assay on such chips will often involve separately controlling the flows through certain channels and selectively directing flows from certain channels through channel intersections. Fluid flow through complex interconnected channel networks can be accomplished by either building microscopic pumps and valves into the chip or applying a combination of driving forces to the channels. The use of multiple electrical or pressure driving forces to control flow in a chip eliminates the need to fabricate valves and pumps on the chip itself, thus simplifying chip design and lowering chip cost.

Lab-on-a-chip type microfluidic devices offer a variety of inherent advantages over conventional laboratory processes such as reduced consumption of sample and reagents, ease of automation, large surface-to-volume ratios, and relatively fast reaction times. Thus, microfluidic devices have the potential to perform diagnostic assays more quickly, reproducibly, and at a lower cost than conventional devices. The advantages of applying microfluidic technology to diagnostic applications were recognized early on in development of microfluidics. For example, microfluidic systems exist in which the steps of sample preparation, PCR (polymerase chain reaction) amplification, and analyte detection are carried out on a single chip.

Many chemical and biochemical analyses require use of beads or other loose material in the process stream. One example is the use of beads to extract a component of interest from a raw biological sample. A core of the bead is coated with a ligand that specifically binds to the component of interest, which can then be removed from the bead. The beads provide an increased surface area with which components in a fluid flowing through the beads can interact. Small beads can be packed more closely than large beads, providing more surface area per unit volume. Beads can be used in the wells of microfluidic devices but must be large enough to avoid being swept into the channels. This limits the packing density that can be achieved and the amount of reaction that can take place in a given volume of the chip. In addition, beads entering the channels can enter the process in undesirable places and can clog flow channels.

It would be desirable to have a microfluidic device with a filter that would overcome the above disadvantages.

SUMMARY OF THE INVENTION

One aspect of the invention provides a microfluidic device including a substrate; a flowpath including a well formed in the substrate in fluid communication with a channel formed in the substrate; and a filter disposed across the flowpath.

Another aspect of the invention provides a method of treatment of process fluid with loose process material including providing a microfluidic device comprising a substrate, a flowpath including a well formed in the substrate in fluid communication with a channel formed in the substrate, and a filter disposed across the flowpath, the filter having openings sized to strain the loose process material from the process fluid; depositing the loose process material in the flowpath upstream of the filter; mixing the loose process material with the process fluid; and draining the process fluid from the loose process material through the filter.

Yet another aspect of the present invention provides a microfluidic device for use with loose process material including a substrate; a flowpath including a well formed in the substrate in fluid communication with a channel formed in the substrate; and means for filtering the loose process material from the flowpath.

DETAILED DESCRIPTION OF PRESENTLY PREFERRED EMBODIMENTS

As noted previously, embodiments of the present invention are directed to a microfluidic device with a filter. Microfluidic devices as defined herein are devices with channels having at least one interior dimension, such as depth or radius, of less than one millimeter.

Figure 1:
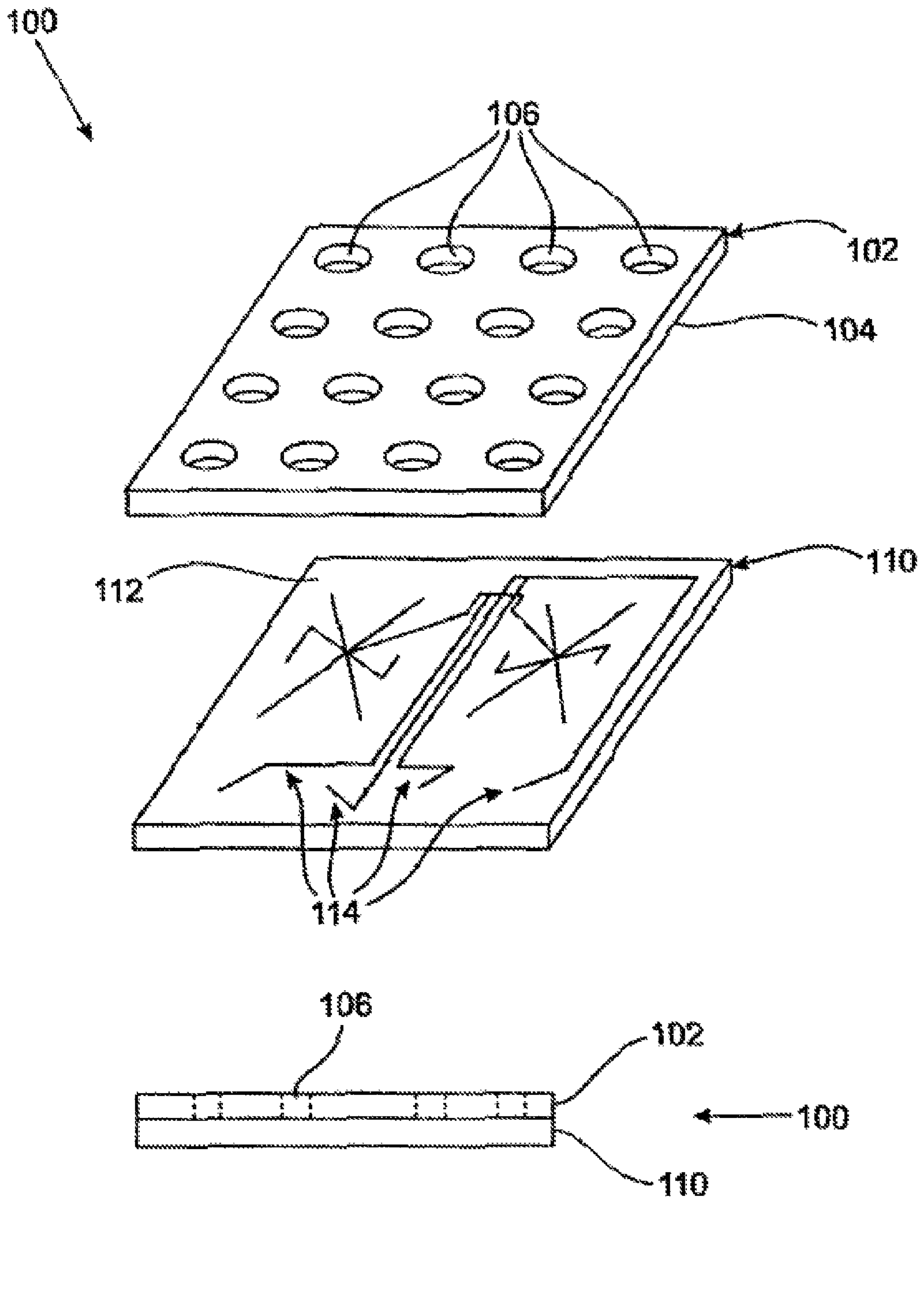
FIG. 1 Prior Art
FIG. 1 is a perspective view of a typical microfluidic device.

FIG. 1 is a perspective view of a typical microfluidic device. The top portion of FIG. 1 shows an exploded view of the microfluidic device 100, which includes a well plate 102 and a channel plate 110; and the bottom portion of FIG. 1 shows a side view of the assembled microfluidic device 100 after the well plate 102 and channel plate 110 have been bonded together. Structures such as channels and/or chambers are formed within the interior of the assembled microfluidic device 100 by fabricating a pattern of channels 114, such as grooves and/or trenches, on a surface 112 of the channel plate 110 and bonding a corresponding surface 104 of the well plate 102 onto the patterned surface 112. When the plates are bonded together, the channels 114 are enclosed, forming flowpaths within the interior of the assembled microfluidic device 100. Access to those channels is provided through wells 106, which are formed by fabricating holes in the upper well plate 102. The wells 106 are positioned to communicate with specific points of the channels 114. For example, the wells 106 can be positioned to communicate with the termini of the channels 114. The channels 114 can include chimney wells in the channel plate 110 in communication with the wells 106 in the well plate 102. The chimney wells acts as reservoirs in the channel plate 110. Those skilled in the art will appreciate that the microfluidic device 100 is not limited to the well plate 102 and channel plate 110 as illustrated. In one example, the microfluidic device 100 is a single substrate. The wells 106 and channels 114 can be formed in fluid communication with each other in the single substrate, such as being formed by molding in the single substrate. In another example, the well plate 102 and/or the channel plate 110 are formed from a number of thinner subplates bonded together.

The wells 106 can be used to introduce fluid into or extract fluid out of the channels 114 of the microfluidic device 100, or to allow driving forces such as electricity or pressure to be applied to the channels 114 to control flow throughout the network of channels 114.

A variety of plate materials may be employed to fabricate a microfluidic device such as microfluidic device 100 in FIG. 1. Since some structures such as the channels will have a linear dimension of less than 1 mm, it is desirable that the plate material be compatible with known microfabrication techniques such as photolithography, wet chemical etching, laser ablation, reactive ion etching (RIE), air abrasion techniques, injection molding, LIGA methods, metal electroforming, or embossing. Another factor to consider when selecting a plate material is whether the material is compatible with the full range of conditions to which the microfluidic devices may be exposed, such as extremes of pH, temperature, salt concentration, and application of electric fields. Yet another factor to consider is the surface properties of the material. Properties of the interior channel surfaces determine how these surfaces chemically interact with materials flowing through the channels, and those properties will also affect the amount of electroosmotic flow that will be generated if an electric field is applied across the length of the channel. Since the surface properties of the channel are so important, techniques are known in the art to either chemically treat or coat the channel surfaces so that those surfaces have the desired properties. Methods of bonding two plates together to form a completed microfluidic device are also known in the art. Those skilled in the art will appreciate that the channel plate 110 can be made of more than one layer, such as a solid base layer and a intermediate channel layer with the channels cut through the intermediate channel layer.

Microfluidic devices can also be fabricated from polymeric materials such as polymethylmethacrylate (PMMA), polycarbonate, polytetrafluoroethylene (PTFE), polyvinylchloride (PVC), polydimethylsiloxane (PDMS), polysulfone, polystyrene, polymethylpentene, polypropylene, polyethylene, polyvinylidine fluoride, ABS (acrylonitrile-butadiene-styrene copolymer), cyclic-olefin polymer (COP), and cyclic-olefin copolymer (COC). Such polymeric plate materials are compatible with a number of the microfabrication techniques described above. Since microfluidic devices fabricated from polymeric plates can be manufactured using low-cost, high-volume processes such as injection molding, polymer microfluidic devices could potentially be less expensive to manufacture than devices made using semiconductor fabrication technology. Nevertheless, there are some difficulties associated with the use of polymeric materials for microfluidic devices. For example, the surfaces of some polymers interact with biological materials, and some polymer materials are not completely transparent to the wavelengths of light used to excite or detect the fluorescent labels commonly used to monitor biochemical systems. Although microfluidic devices may be fabricated from a variety of materials, there can be tradeoffs associated with each material choice.

Materials normally associated with the semiconductor industry are often used as microfluidic plates because microfabrication techniques for those materials are well established. Examples of such materials are glass, quartz, and silicon. In the case of semiconductive materials such as silicon, it will often be desirable to provide an insulating coating or layer, e.g., silicon oxide, over the plate material, particularly in those applications where electric fields are to be applied to the device or its contents. For example, the microfluidic devices employed in the Agilent Bioanalyzer 2100 system are fabricated from glass or quartz because of the ease of microfabricating those materials and because those materials are generally inert in relation to many biological compounds.

Wells on microfluidic devices can be configured in a number of different ways. The well is a fluid-containing reservoir that is connected to one or more of the channels within the interior of the microfluidic device. During operation, the wells serve as either a source of fluid to be introduced into the channel network or as a receptacle for fluid exiting the fluid network. Wells are typically accessible from the exterior of the chip. The volume of those wells 106 can be determined by the thickness of the top plate layer 102 and by the diameter of the circular opening forming the well 106. Exemplary glass plates range in thickness from about 0.5-2 mm. When the holes forming the wells 106 have a diameter ranging from about 0.5-3 mm, and the volume of the wells formed by the well openings would range from 0.1-15 μl. Higher volume wells can be formed by attaching a cover layer to the microfluidic device so that apertures in the cover layer are aligned with the wells 106.

Loose process material, such as process beads, a material capture mat, silica beads, silica coated polymer beads, diatomaceous earth, or the like, can be placed in the wells 106 and/or the channels 114 to process materials included in process fluids that flow through the microfluidic device 100. The loose process material can be used to prepare a sample, such as nucleic acid (DNA and/or RNA) or proteins, and bind a component of interest in the process fluids to the loose process material. The loose process material can have exemplary dimensions from about 0.05 μm to 500 μm.

Figure 2A:
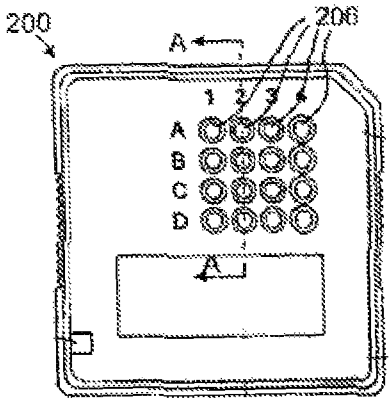
FIGS. 2A through 2E are various views of cover layers that may be used as components of a microfluidic device in accordance with the present invention.
Figure 2B:
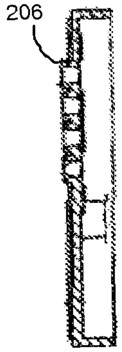
Figure 2C:
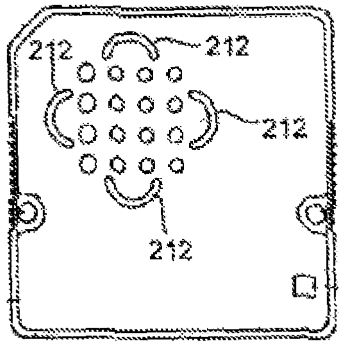
Figure 2D:
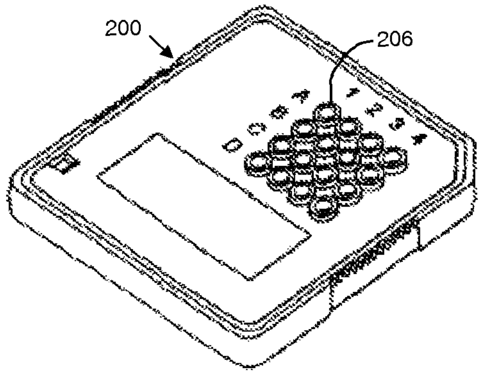
Figure 2E:
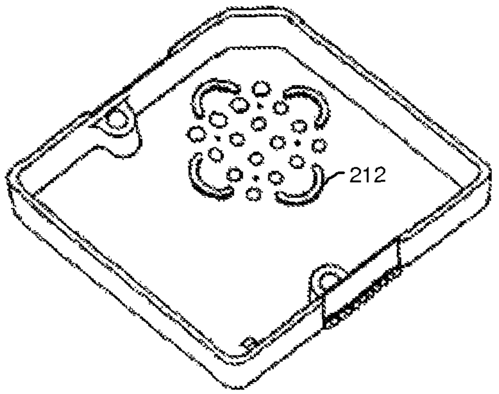
Figure 2E Prior Art

FIGS. 2A-2E are various views of cover layers that may be used as components of a microfluidic device in accordance with the present invention. FIGS. 2A-2E show a cover layer 200 that can be used with the microfluidic device 100 shown in FIG. 1. FIG. 2A is a top view, FIG. 2B a cross-sectional view, FIG. 2C an underside view, FIG. 2D a perspective view of the top side, and FIG. 2E a perspective view of the bottom side of the cover layer 200. The cover layer 200 is designed to receive the microfluidic device 100 in a mounting region on the underside of the cover layer 200 that is delineated by four ridges 212 that protrude from the underside of the cover layer 200.

Figure 3:
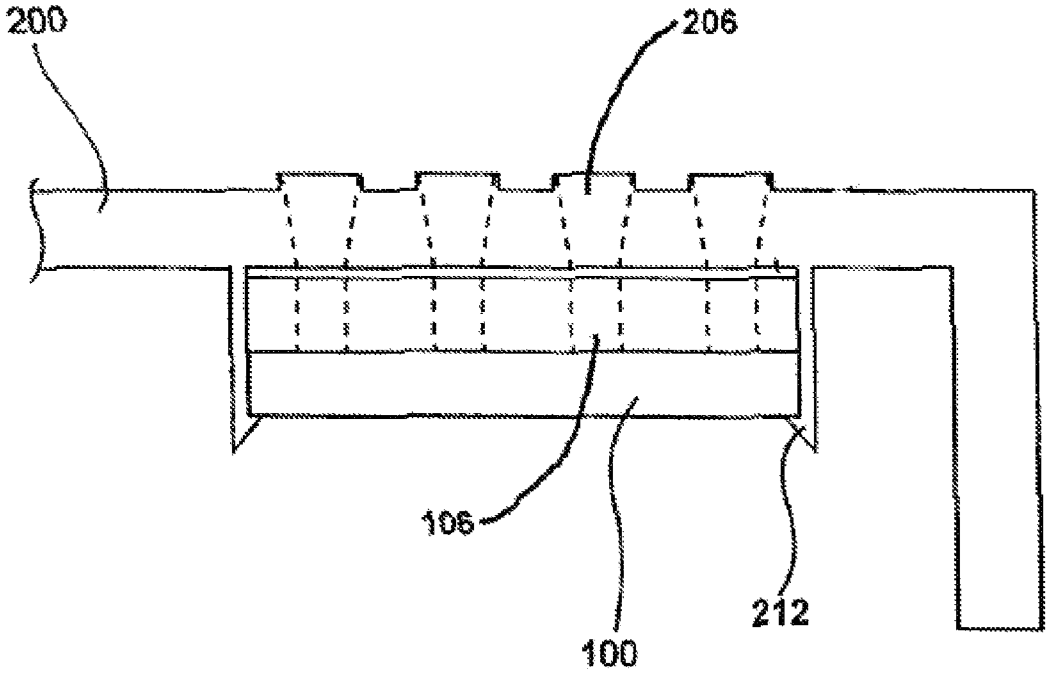
FIG. 3 Prior Art
FIG. 3 is a cross-sectional view across the line A-A in FIG. 2A.

A cross-sectional view across the line A-A in FIG. 2A is shown in FIG. 3. In FIG. 3, a microfluidic device 100 is mounted onto the underside of a cover layer 200. The apertures 206 in the cover layer are aligned with the wells 106 in the microfluidic device 100, and the combination of each aperture 206 and well 106 forms a larger well with a total volume equal to the volume of the aperture 206 and the volume of the well 106.

The microfluidic devices can be any number of microfluidic devices, not just the device shown in FIGS. 1-3. The defining characteristics of a microfluidic device that is compatible with the practice of the invention is simply that the device contains a well, and that flow into and out of the well can be controlled by an instrument that interfaces with the microfluidic device. For example, the invention could be practiced on microfluidic devices formed from more than two plate layers. Also, although microfluidic devices compatible with the invention are typically substantially planar, the major surface of the microfluidic device does not have to be rectangular or square.

The material from which the microfluidic device is made can be any material suitable for a desired application, as long as the material does not contaminate or otherwise interfere with the reagents, samples, or reactions involved in practicing the invention. The details of the well structure, such as its cross-sectional shape, whether it is formed entirely within one plate, in multiple plates, or in a plate and a cover layer, can be selected for the particular application, as long as the well interfaces with a microfluidic channel network, and as long as the well is large enough to accommodate enough process fluid and loose process material to procure the desired amount of the component of interest. For example, when the well is formed from the combination of a well in a microfluidic device and an aperture in a cover layer, the aperture and well do not have to be the same shape, size, or depth, as long as the combination of the aperture and well define a volume capable of being used as a fluid reservoir.

Figure 4:
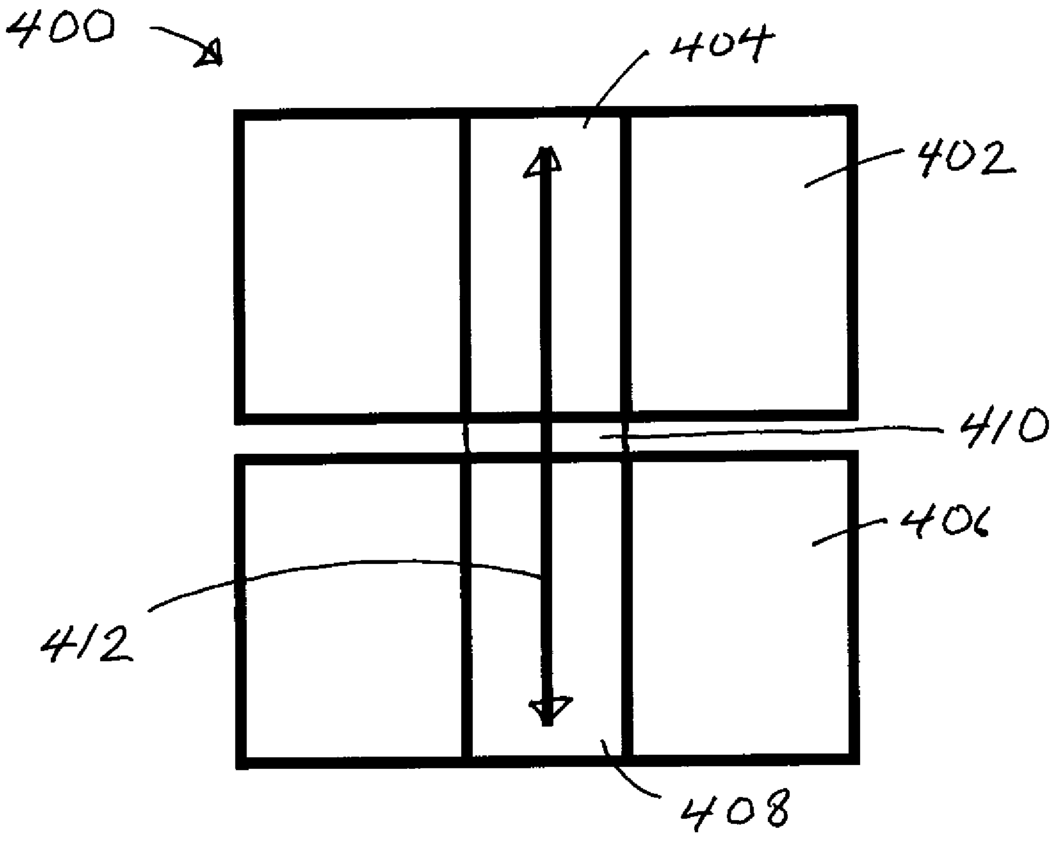
FIG. 4 is a block diagram of a microfluidic device made in accordance with the present invention.

FIG. 4 is a block diagram of a microfluidic device made in accordance with the present invention. The microfluidic device 400 includes a well plate 402 with a well 404 formed in the well plate 402, a channel plate 406 with a channel 408 formed in the channel plate 406, and a filter 410. A flowpath 412 includes the well 404 in fluid communication with the channel 408. The filter 410 is disposed across the flowpath 412, which can flow from the well 404 to the channel 408, or from the channel 408 to the well 404, as desired for a particular application or series of steps within a particular application. A number of wells can be in fluid communication with a given channel and/or a number of channels can be in fluid communication with a given well as desired for a particular application. The channel plate 406 can include chimney wells in fluid communication with the channels. Those skilled in the art will appreciate that the microfluidic device 400 is not limited to one well plate 402 and one channel plate 406 as illustrated. In one example, the microfluidic device 400 is a single substrate. The wells 404 and channels 408 can be formed in fluid communication with each other in the single substrate, such as being formed by molding in the single substrate. In another example, the well plate 402 and/or the channel plate 406 are formed from a number of thinner subplates bonded together.

The filter 410 can be made of material as desired for a particular application. When the filter 410 is a membrane, the filter 410 can be made of nylon, cellulose, cellulose ester, polyvinylidene difluoride (PVDF), polyethersulfone (PES), polytetrafluoroethylene (PTFE), polyester, polypropylene, polyethylene, or the like. The filter 410 can also be coated with hydrophobic or hydrophilic material.

The filter 410 can also made from the materials above impregnated with silica beads. In this case, loose material is not needed as the silica in the membrane acts as capture material.

Another configuration is to have a separate filter basket placed into a regular chip well. The filter basket is maintained in the chip well mechanically. The filter basket can contain any of the filter materials described above.

Figure 5A:
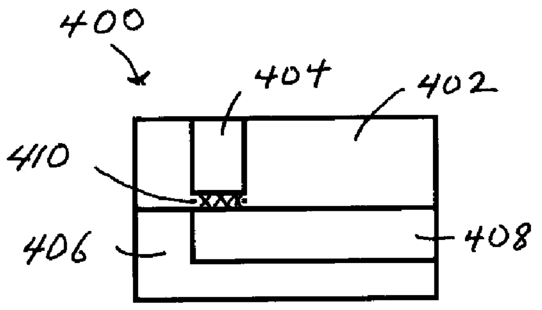
FIGS. 5A through 5R are various views of microfluidic devices made in accordance with the present invention.
Figure 5B:
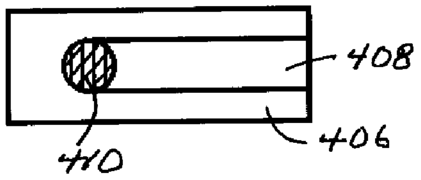
Figure 5C:
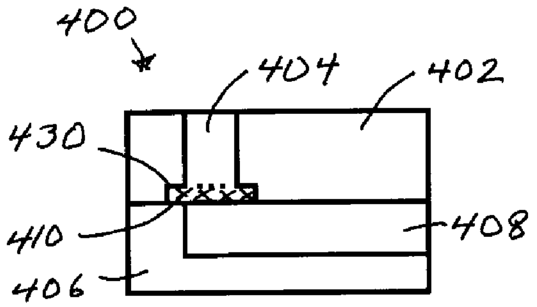
Figure 5D:
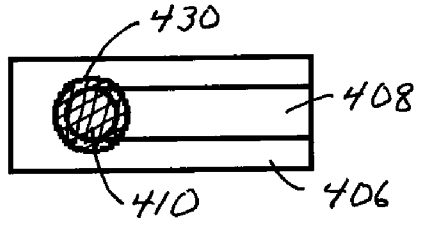
Figure 5E:
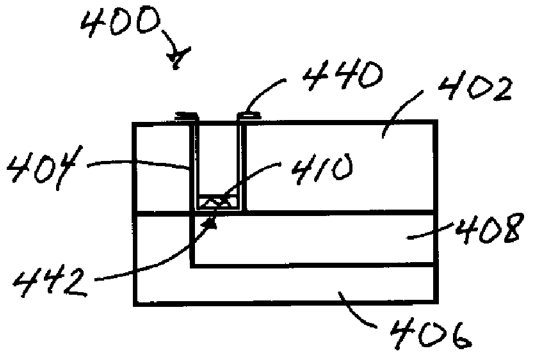
Figure 5F:
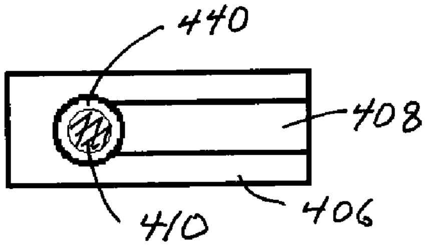
Figure 5G:
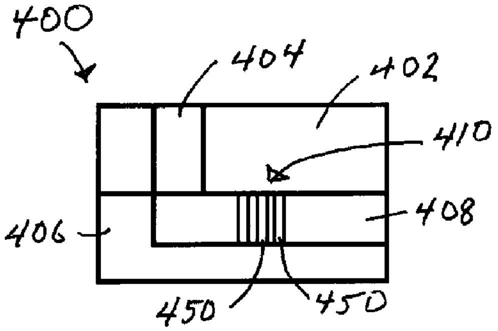
Figure 5H:
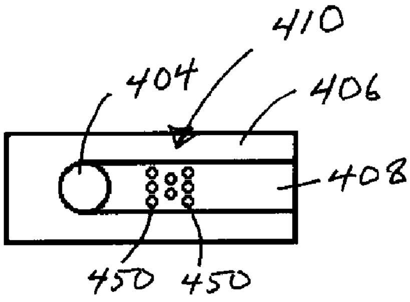
Figure 5I:
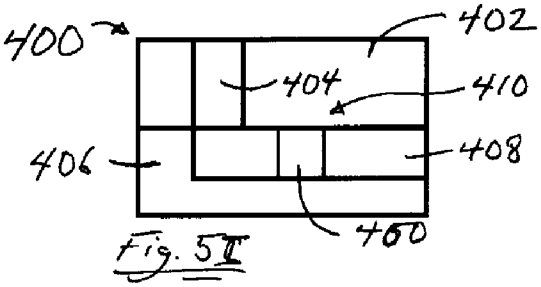
Figure 5J:
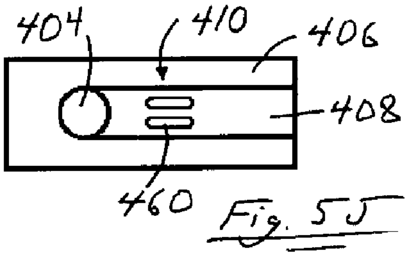
Figure 5K:
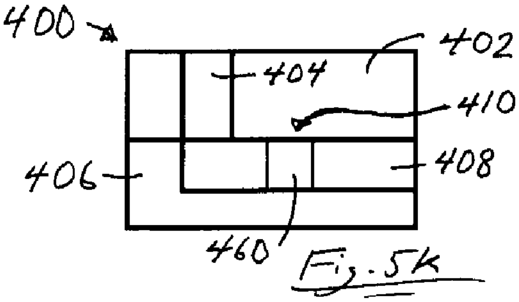
Figure 5L:
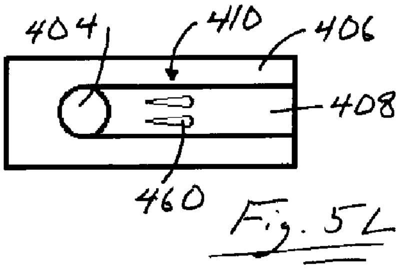
Figure 5M:
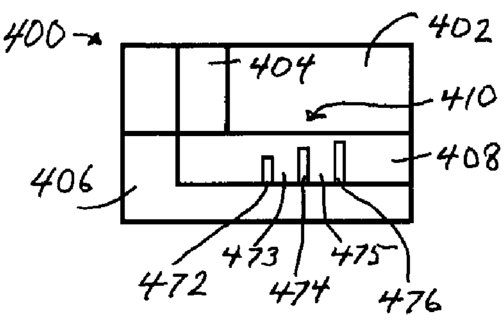
Figure 5N:
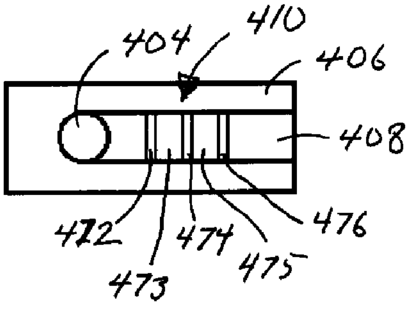
Figure 5O:
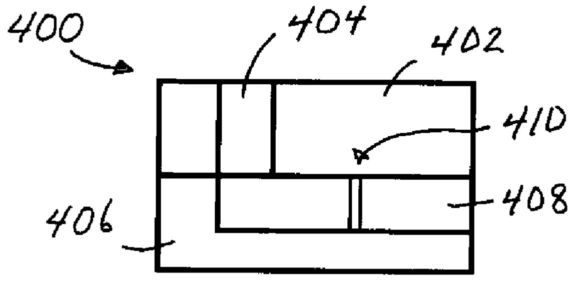
Figure 5P:
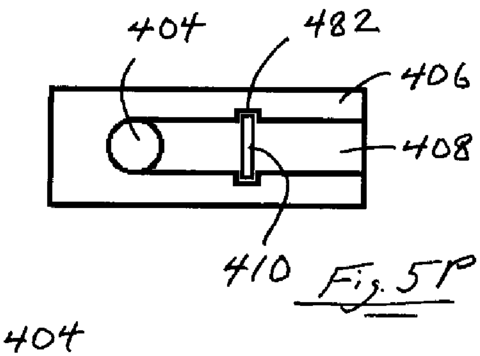
Figure 5Q:
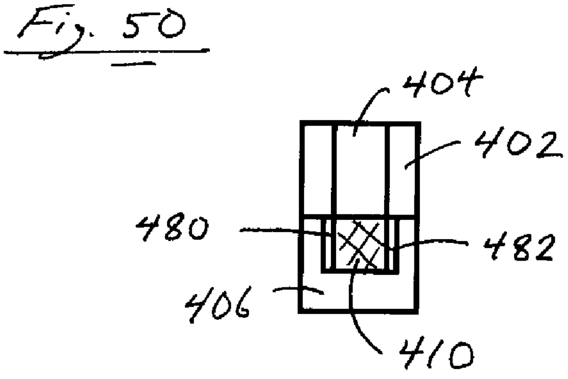

FIGS. 5A-5Q, in which like elements share like reference numbers with each other and with FIG. 4, are various views of microfluidic devices made in accordance with the present invention. FIGS. 5A-5F illustrate microfluidic devices with the filter associated with the well. FIGS. 5G-5Q illustrate microfluidic devices with the filter associated with the channel. The openings in the filter are sized to prevent loose process material from passing through the filter. The filter can have openings between about 0.05 μm to 500 μm. Those skilled in the art will appreciate that the dimensions are exaggerated for clarity of illustration.

The features of the microfluidic device 400, such as the wells, channels, filters, and filter receivers, can be made in a single step or a series of steps as desired. The microfluidic device 400 can be formed as a single substrate, or a well plate and a channel plate can be manufactured separately, and then combined to form the microfluidic device 400. The features can be made by removing material from the single substrate or plate, such as removal by photolithography or embossing, or by forming with the single substrate or plate, such as forming by injection molding. Those skilled in the art will appreciate that the fabrication method can be selected to suit the particular materials to be used.

Referring to FIGS. 5A and 5B, which are respectively a side view and a top view of a microfluidic device 400, the filter 410 is formed into the well plate 402, so that the filter 410 is part of the well plate 402. When the well plate 402 is made of plastic, the filter 410 can be molded with the well plate 402. When the microfluidic device 400 is a single substrate, such that the well plate 402 and the channel plate 406 are part of the single substrate, the filter 410 can be molded with the single substrate and formed into the substrate. The edges of the filter 410 are held by the single substrate with the filter 410 across the flowpath.

Referring to FIGS. 5C and 5D, which are respectively a side view and a top view of a microfluidic device 400, a filter receiver 430 is formed across the flowpath between the well plate 402 and the channel plate 406. The filter 410 is retained in the filter receiver 430. In one embodiment, the filter 410 is glued in the filter receiver 430. In another embodiment, the filter 410 is held mechanically in the filter receiver 430. The filter 410 can be retained in the filter receiver 430 when the well plate 402 and/or the channel plate 110 are made of plastic or glass. Those skilled in the art will appreciate that the filter receiver 430 can be formed in the well plate 402, in the channel plate 406, or partially in the well plate 402 and partially in the channel plate 406. When a cover layer is used with the microfluidic device 400, the filter can be retained in a filter receiver between the apertures in the cover layer and the wells in the well plate.

Referring to FIGS. 5E and 5F, which are respectively a side view and a top view of a microfluidic device 400, a basket 440 with a bottom 442 is fitted into the well 404. The filter 410 is attached to the bottom 442 of the basket 440. The basket 440 can be made of the same or different materials as the well plate 402 and/or the channel plate 406. The basket 440 can be sized so as to be permanently retained in the well 404 or can be removable for replacement.

Referring to FIGS. 5G and 5H, which are respectively a side view and a top view of a microfluidic device 400, the filter 410 is a number of posts 450 formed into the channel plate 406 across the channel 408. The posts 450 can be formed in one or more rows across the channel 408 and spaced apart to prevent loose process material from passing between the posts 450. In one embodiment, the posts 450 are formed by photolithography simultaneously with forming the channel 408. In another embodiment, the posts 450 are formed by injection molding when the channel plate 406 or single substrate is formed. In yet another embodiment, the posts 450 are formed by embossing.

Referring to FIGS. 5I and 5J, which are respectively a side view and a top view of a microfluidic device 400, the filter 410 is a number of in-line bars 460 formed into the channel plate 406 across the channel 408. The in-line bars 460 can be formed in one or more rows across the channel 408 and spaced apart to prevent loose process material from passing between the in-line bars 460. The in-line bars 460 can be formed by photolithography simultaneously with forming the channel 408. Referring to FIGS. 5K and 5L, which are respectively a side view and a top view of a microfluidic device 400, the in-line bars 460 formed into the channel plate 406 across the channel 408 are streamlined, i.e., the shape of the in-line bars 460 is selected to reduce the pressure drop along the channel 408 across the in-line bars 460. A small pressure drop maintains flow through the channel 408 and avoids an abrupt blockage. In one embodiment, the in-line bars 460 are formed by photolithography simultaneously with forming the channel 408. In another embodiment, the in-line bars 460 are formed by injection molding when the channel plate 406 or single substrate is formed. In yet another embodiment, the in-line bars 460 are formed by embossing.

Figure 5R:
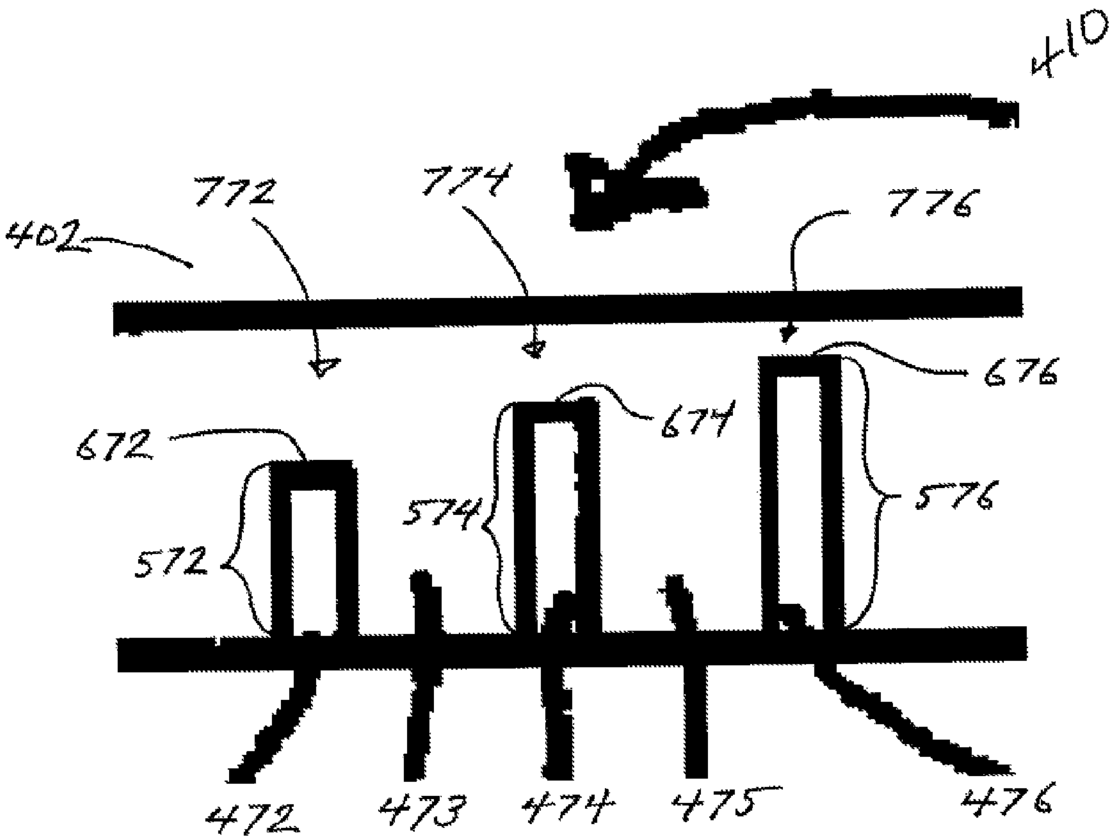

Referring to FIGS. 5M and 5N, which are respectively a side view and a top view of a microfluidic device 400, the filter 410 is any desired number of cross-channel dams 472, 474, 476 formed into the channel plate 406. FIG. 5R is a detail side view of the filter 410 as illustrated in FIG. 5M. The cross-channel dams 472, 474, 476 increase in height 572, 574, 576 along the flowpath. Pools 473, 475 between the cross-channel dams 472, 474, 476 allow loose process material entrained in the process fluid to settle out as desired. The space 772, 774, 776 between the top 672, 674, 676 of each cross-channel dam and the well plate 402 allows loose process material of different sizes to be stopped by the different cross-channel dams 472, 474, 476. In one embodiment, the cross-channel dams 472, 474, 476 are formed by photolithography in steps to form the different heights. In another embodiment, the cross-channel dams 472, 474, 476 are formed by injection molding when the channel plate 406 or single substrate is formed. In yet another embodiment, the cross-channel dams 472, 474, 476 are formed by embossing.

Referring to FIGS. 5O-5Q, which are respectively a side view, top view, and end view of a microfluidic device 400, the channel 408 has a channel periphery 480, into which a filter receiver 482 is formed into the channel plate 406. The filter 410 is a screen slidably disposed in the filter receiver 482. The filter receiver 482 can be formed by photolithography simultaneously with forming the channel 408. The filter receiver 482 can optionally be formed by injection molding or embossing.

The microfluidic device can optionally include a material capture mat affixed to the filter. The material capture mat can process components of interest included in process fluids that flow through the microfluidic device 400. The loose process material can be used to prepare a sample, such as nucleic acid (DNA and/or RNA) or proteins, and bind a component of interest in the process fluids to the material capture mat. The material capture mat can be made of a silica based material or the like.

Figure 6:
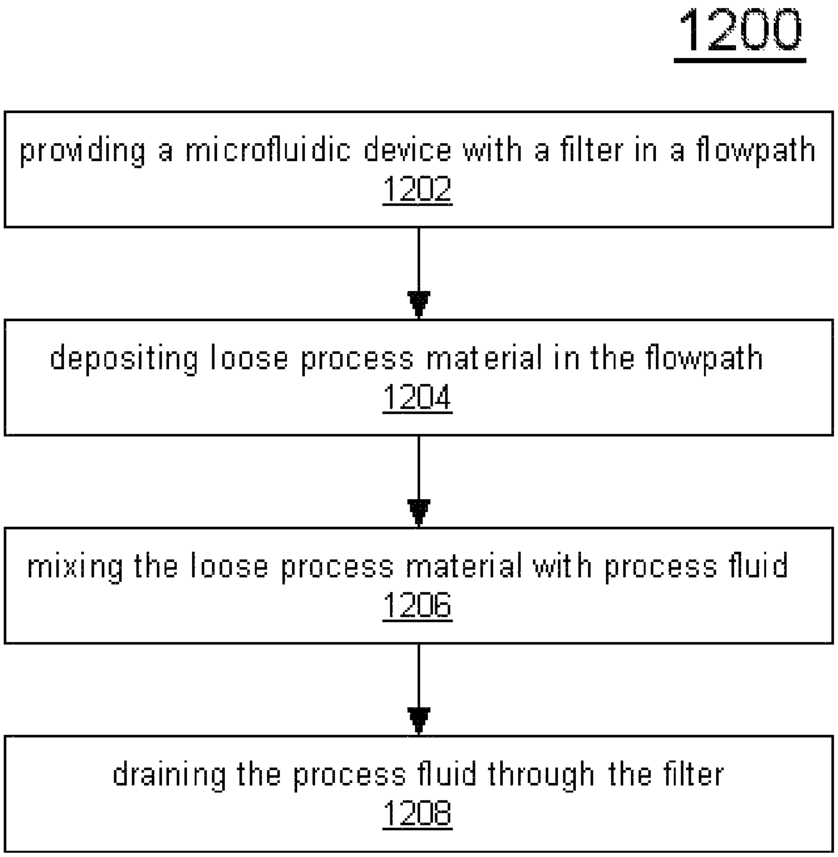
FIG. 6 is a flowchart for a method of treatment of process fluid with loose process material using a microfluidic device made in accordance with the present invention.

FIG. 6 is a flowchart for a method of treatment of process fluid with loose process material using a microfluidic device made in accordance with the present invention. The method 1200 includes providing a microfluidic device with a filter in a flowpath 1202, depositing loose process material in the flowpath 1204, mixing the loose process material with process fluid 1206, and draining the process fluid through the filter 1208.

Providing a microfluidic device with a filter in a flowpath 1202 includes providing a microfluidic device having a well plate, a channel plate, a flowpath including a well formed in the well plate in fluid communication with a channel formed in the channel plate, and a filter disposed across the flowpath, the filter having openings sized to strain the loose process material from the process fluid, such as described in FIGS. 4 and 5 above. In one embodiment, the filter is disposed in the well. In another embodiment, the filter is disposed in the channel.

Depositing loose process material in the flowpath 1204 includes depositing the loose process material in the flowpath upstream of the filter. Examples of loose process materials include process beads, a material capture mat, silica beads, silica coated polymer beads, silica coated magnetic beads, diatomaceous earth, or the like. In one embodiment, the process fluid including the component of interest is mixed with the loose process material before the loose process material is deposited into the flowpath. The mixing can be performed before the loose process material is loaded onto the microfluidic device or can be performed on the microfluidic device.

Draining the process fluid through the filter 1208 includes draining the process fluid from the loose process material through the filter. When more than one wash is desired for a particular application, the method 1200 can continue by re-mixing the loose process material with the process fluid and re-draining the process fluid from the loose process material. After the desired number of washes, a release reagent can be mixed with the loose process material to release the component of interest from the loose process material and the eluent including the component of interest collected in an eluent collection well on the microfluidic device.

The well can have a top and a bottom, with the filter disposed at the bottom. In one embodiment, the mixing the loose process material with process fluid 1206 includes dispensing the process fluid into the well from the top and the draining the process fluid from the loose process material through the filter 1208 includes draining the process fluid through the bottom. This is a unidirectional wash, since the process fluid enters the well in one direction and exits in the same direction. In another embodiment, the mixing the loose process material with process fluid 1206 includes dispensing the process fluid into the well from the bottom and the draining the process fluid from the loose process material through the filter 1208 includes draining the process fluid through the bottom. This is a bi-directional wash, since the process fluid enters the well in one direction, reverses, and exits in another direction.

Other approaches can also be used to accomplish a unidirectional wash. In one embodiment, a spigot is molded in the well above the filter and connected to a wash-in channel providing process fluid. The spigot delivers the process fluid from the top. The filter is drained through a wash-out channel below the filter. A wash well can also be provided below the filter to evacuate the well. In another embodiment, a large well in the well plate is in fluid connection with two chimney wells in the channel plate. A filter is disposed between the large well and each of the chimney wells. The process fluid fills the large well from one of the chimney wells and drains the large well from the other of the chimney wells. Those skilled in the art will appreciate that the same approach can be used in other layers. For example, the large well could be formed as a large aperture in the cover layer and the multiple wells (the chimney wells in the previous example) can be formed in the well layer.

The invention can be embodied in other specific forms without departing from the spirit or essential characteristics thereof. The present embodiments, therefore, are to be considered in all respects as illustrative and not restrictive, the scope of the invention being indicated by the appended claims rather than by the foregoing description, and all changes which come within the meaning and range of equivalency of the claims are therefore intended to be embraced therein.

What is claimed is:

1. A microfluidic device for use with loose process material, the loose process material including first process material of a first size and second process material of a second size, the first size being different from the second size, the microfluidic device comprising:

a substrate comprising a well plate and a channel plate;

a flowpath including a well formed in the well plate in fluid communication with a channel formed on a surface of the channel plate, the channel including a bottom and sides extending from the bottom to the well plate; and a filter disposed across the flowpath, wherein the filter is a plurality of cross-channel dams formed into the channel plate, each of the plurality of cross-channel dams extending from the bottom completely across the channel between the sides, each of the plurality of cross-channel dams having a top and a height between the bottom of the channel and the top, the top of each of the cross-channel dams and the well plate defining a space adjacent the well plate for each of the plurality of cross-channel dams;

wherein the plurality of cross-channel dams includes a first cross-channel dam and a second cross-channel dam;

a height of the space-between the top of the first cross-channel dam and the well plate being so dimensioned to stop the first process material and not to stop the second process material; and a height of the space-between the top of the second cross-channel dam and the well plate being so dimensioned to stop the second process material.

2. The microfluidic device of claim 1 wherein the filter is formed into the substrate.

3. The microfluidic device of claim 2 wherein the filter is formed into the substrate by removing material from the substrate.

4. The microfluidic device of claim 3, wherein the filter is formed by photolithography.

5. The microfluidic device of claim 2 wherein the filter is formed into the substrate by being formed with the substrate.

6. The microfluidic device of claim 5, wherein the filter is formed by injection molding.

7. The microfluidic device of claim 5, wherein the filter is formed by embossing.

8. The microfluidic device of claim 1 wherein the first size is between 0.05 μm and 500 μm.

* * * * *